United States Patent [19]

Iacovangelo

[11] Patent Number: 5,206,055

[45] Date of Patent: Apr. 27, 1993

[54] METHOD FOR ENHANCING THE UNIFORM ELECTROLESS DEPOSITION OF GOLD ONTO A PALLADIUM SUBSTRATE

[75] Inventor: Charles D. Iacovangelo, Schenectady, N.Y.

[73] Assignee: General Electric Company, Schenectady, N.Y.

[21] Appl. No.: 754,485

[22] Filed: Sep. 3, 1991

[51] Int. Cl.$^5$ .............................................. C23C 26/00
[52] U.S. Cl. .................................. 427/304; 427/437; 427/443.1
[58] Field of Search ................ 427/443.1, 437, 438, 427/304, 305, 306

[56] References Cited

U.S. PATENT DOCUMENTS

| | | | |
|---|---|---|---|
| 3,589,916 | 6/1971 | McCormack | 427/437 |
| 3,700,469 | 10/1972 | Okinaka | 427/437 |
| 3,917,885 | 11/1975 | Baker | 427/304 |
| 4,279,951 | 7/1981 | Hough | 427/304 |
| 4,337,091 | 6/1982 | El-Shazly | 427/304 |
| 4,424,241 | 1/1984 | Abys | 427/305 |
| 4,804,410 | 2/1989 | Haga | 427/304 |
| 4,863,766 | 9/1989 | Iacovangelo | 427/443.1 |
| 4,978,559 | 12/1990 | Iacovangelo | 427/304 |
| 4,985,076 | 1/1991 | Iacovangelo | 106/1.26 |

FOREIGN PATENT DOCUMENTS 747872 12/1966 Canada .................................. 427/437

Primary Examiner—Shrive Beck
Assistant Examiner—Vi Duong Dang
Attorney, Agent, or Firm—William A. Teoli; William H. Pittman

[57] ABSTRACT

It has been found that the prior activation of a palladium substrate, such as palladium electrolessly deposited onto nickel, in an aqueous solution of an alkali metal hydroxide, an alkali metal carbonate and a reducing agent, for example, dimethylamine borane, can provide an enhancement in the thickness and uniformity of electrolessly deposited gold when the activated substrate is placed in an electroless gold bath.

3 Claims, No Drawings

METHOD FOR ENHANCING THE UNIFORM ELECTROLESS DEPOSITION OF GOLD ONTO A PALLADIUM SUBSTRATE

BACKGROUND OF THE INVENTION

The present invention relates to a method for electrolessly depositing gold onto a palladium substrate in a uniform manner. More particularly, the present invention relates to a method for activating a palladium substrate prior to electroless gold deposition, to serve as an intermediate barrier layer between the electroless deposited gold and another metal such as nickel to reduce diffusion of such underlying metal into the gold grain boundaries.

Electroless plating is useful in applications requiring coatings for complex shapes. This capacity makes electroless plating techniques particularly useful in the electronics industry, for example, in the metallization of conductors and insulators in printed circuit boards. Base metals such as nickel and copper are often used in electroless plating processes to metallize conductors and insulators. However, because of its low contact resistance and beneficial effects on bonding leads, electroless gold plating is continually desired for coating complex shapes and electrically isolated tracks and bonding pads in printed circuit boards. It has been found, however, that electroless gold plating baths are not as easy to operate as the electroless base metal plating baths, for example, with respect to bath stability and plating rate.

The term "autocatalytic" is used herein to describe a plating system which is capable of depositing gold on a gold substrate. Autocatalytic gold plating is advantageous, for example, for increasing the thickness of existing gold surfaces which are too thin for some uses. Autocatalytic electroless gold plating compositions are known in the art. Reference may be made, for example, to U.S. Pat. Nos. 3,700,469; 3,917,885; and 4,337,091.

U.S. Pat No. 3,700,469 to Okinaka discloses an autocatalytic electroless gold plating bath containing a soluble gold cyanide complex ion, excess free cyanide to stabilize the gold cyanide complex ion, an alkaline agent as a pH adjustor, and an alkali metal borohydride or dimethylamine borane as a reducing agent. Although a truly autocatalytic plating bath, the Okinaka bath has several limitations including instability, low plating rate (about 1 micron per hour), difficulty of bath replenishment, and sensitivity to nickel ions in solution.

U.S. Pat. No. 3,917,885 Baker discloses an autocatalytic electroless plating bath purportedly having improved stability by adding to the bath an alkali metal imide complex of the metal to be plated, e.g., gold. However, the Baker bath has been found to have the same problems as the Okinaka bath, especially sensitivity to nickel contamination and deteriorating plating rate.

U.S. Pat. No. 4,337,091 to El-Shazly et al discloses the use of trivalent gold metal complexes as the source of gold in an electroless gold plating bath, the reducing agent being any of the borohydrides, cyanoborohydrides or amine boranes that are soluble and stable in aqueous solution. A later version of the El-Shazly bath, disclosed in U.K. Patent Application G.B. No. 21/21/444A, uses a mixture of trivalent and monovalent water-soluble gold cyanide complexes. The El-Shazly baths suffer from the same limitations as the prior art baths described above.

In autocatalytic plating, oxidation/reduction reactions begin simultaneously when the substrate is immersed in the plating bath. These reactions occur at the surface of the metal or metallized substrate. At the substrate, the gold ions accept electrons from the reducing agent and deposit a gold film on the substrate. Initially, the reducing agent reacts on the substrate, giving electrons to the metal ions and being converted to its oxidized form. The gold film then catalyzes the reaction and causes it to continue autocatalytically.

In an electroless bath containing an alkali metal gold cyanide complex, an alkali metal cyanide complexing agent, an alkali metal hydroxide, and dimethylamine borane as a reducing agent, cyanide is a strong poison for the oxidation of the reducing agent. However, cyanide is necessary to prevent the spontaneous decomposition of the bath as shown below:

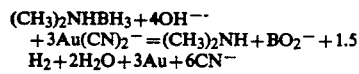

Although electroless gold plating is continually desired for coating complex shapes and useful in bonding pads and printed circuit boards, base metals such as nickel and copper which are often used in electroless plating processes often contaminate the gold surface as a result of intermetallic diffusion. Problems in joining, for example, soldering, thermal compression bonding or ultrasonic bonding and the alteration of the surface resistivity of the gold can result. The problem of diffusion was investigated by Paul et al, as shown in Thin Solid Films 53 (1978) 175–182. Conductive multilayers of metals having an underlying base metal and intermediate protective layer and an outer conductive layer such as gold were studied. Although various techniques have been used to reduce surface diffusion between an underlying metal substrate such as nickel or titanium and an outer conductive substrate such as gold, it has been found that most electroless gold plating compositions either did not plate at all onto barrier layers such as palladium, or plated sporadically with inconsistent incubation periods. In fact, many baths use palladium electrodes to measure the potential of the bath, since gold does not plate onto the palladium. It would be desirable therefore to be able to provide a procedure for activating palladium to allow uniform electroless gold deposition onto the palladium substrate.

SUMMARY OF THE INVENTION

The present invention is based on the discovery that a method of applying a uniform layer of electroless gold onto a palladium substrate is feasible by activating the palladium substrate in an aqueous solution of an alkali metal hydroxide, alkali carbonate and a reducing agent, such as an alkali metal borohydride, dimethylamine borane or hydrazine, prior to immersing the palladium substrate into an electroless gold bath. As a result improved techniques are now feasible for making electronic circuits which must survive elevated thermal cycles, where palladium is used as a barrier to underlying surface metals, such as nickel, to reduce the diffusion of such base metals into the grain boundaries of gold.

STATEMENT OF THE INVENTION

There is provided by the present invention a method for making a gold-palladium composite which comprises, (1) activating a palladium substrate by immersing it in an aqueous activating solution for at least 6 seconds at a temperature in the range of 50° C. to 100° C., where the aqueous activating solution comprises from about 2 to about 50% by weight solids, and consists essentially of about 1.0 to about 15% by weight of alkali metal hydroxide, about 1.0 to about 30% by weight of alkali metal carbonate and about 0.05 to about 5% by weight of a reducing agent based on the weight of aqueous activating solution, and (2) immersing the activated palladium substrate of (1) into an electroless gold bath until at least 0.1 micron of gold has been uniformly electrolessly deposited onto the palladium substrate.

Gold contained in the plating bath of the invention is in the form of the complex ion $Au(CN)_2^-$. It is introduced in the bath as a water-soluble alkali metal gold cyanide complex, such as potassium gold cyanide, sodium gold cyanide or lithium gold cyanide, and preferably as potassium gold cyanide. The concentration of the gold cyanide complex ranges from a minimum concentration which yields reasonable plating rates to a concentration above which no improvement in bath characteristics is obtained. Typically, this concentration is in the range of about 0.002 to about 0.05, preferably about 0.005 to about 0.0075, and most preferably about 0.005 to about 0.006, M.

It is essential that the electroless plating bath of this invention contain free cyanide ion in order to stabilize the gold cyanide complex. Free cyanide increases the stability of the bath and prevents spontaneous liberation of metallic gold in the presence of the reducing agent. The free cyanide is added to the bath as a water soluble cyanide compound. Suitable water soluble cyanide compounds for use in this invention include the alkali metal cyanides, such as sodium, potassium and lithium cyanide. Among these sodium and potassium cyanide are preferred, with potassium cyanide being most preferred.

The amount of the cyanide compound to be added to the bath is critical. Too low a concentration of cyanide can result in spontaneous reduction of the gold ions, while too high a concentration can result in the rapid deterioration of the plating rate. In general, the cyanide compound should be added in an amount ranging from about 0.01 to about 0.1, and preferably about 0.01 to about 0.04, and most preferably about 0.025 to about 0.035, M.

The reducing agents used in the bath to supply electrons to the oxidation-reduction reaction include any of the borohydrides or amine boranes which are soluble and stable in aqueous solution. Thus, alkali metal borohydrides, preferably sodium and potassium borohydrides, can be used, although various substituted borohydrides, such as sodium or potassium trimethoxyborohydride, may also be used. The preferred reducing agents for use in the present invention are the amine boranes such as mono-and di-lower alkyl, e.g., up to C6 alkyl-amine boranes, preferably isopropyl amine borane and dimethylamine borane. For purposes of the present invention, dimethylamine borane is preferred. Hydrazine also can be used.

The amount of reducing agent added to the bath is typically about 0.01 to about 0.1, and preferably about 0.04 to about 0.08, and most preferably about 0.045 to about 0.055, M.

The plating composition of this invention should be maintained at a pH within the range of about 10 to about 14, and preferably about 12 to about 14, in order to obtain the desired results. It is therefore preferred that an alkali metal hydroxide, such as sodium or potassium hydroxide, and preferably potassium hydroxide be used to maintain the pH at this level.

The amount of alkali metal hydroxide added to the bath is generally about 0.25 to about 1.0, and preferably about 0.78 to about 0.82, and most preferably about 0.80, M.

In addition, other substances such as, for example, lead, thiourea, arsenic, and the like, may be added in order to improve its properties. For example, lead is commonly added to electroless plating baths in the form of a lead salt to prevent the formation of metal particulates or "seeds" which continue to grow until the entire solution is depleted of metal ions. Without lead, any small particles which enter the bath, e.g., dust, will nucleate seeds. Lead cyanide also can act as a poison for the oxidation of the reducing agent. However, also like cyanide, lead stabilizes the bath against spontaneous decomposition.

Examples of suitable lead salts for use herein include lead acetate, lead citrate, lead maleate, lead phosphate, lead tartrate, lead sulfate, and mixtures thereof. Lead acetate is preferred. When lead is used, it is generally present in an amount ranging from about 1 to about 15, and preferably about 3 to about 15, and most preferably about 5, ppm.

The following table describes a typical gold plating bath composition (1 liter) with optimal concentrations given providing the greatest stability (i.e., with respect to bath life and operating conditions):

TABLE 1

| | |
|---|---|
| Dimethylamine Borane | 0.050 M |
| Potassium Gold Cyanide | 0.005 M |
| Potassium Cyanide | 0.035 M |
| Potassium Hydroxide | 0.800 M |
| Potassium Carbonate | 0.750 M |
| Lead (as Lead Acetate) | 5 ppm |

The balance of the electroless plating bath of this invention is distilled water. The bath is normally operated at a temperature of between about 70° C. and 100° C. Optimal operation will be at 80° C., at which temperature the rate of gold deposition is up to about 10 micrometers per hour.

The palladium activating solution can be made by adding the alkali metal hydroxide, alkali metal carbonate and reducing agent to water. The order of addition of the various components is not critical. Some of the alkali metal hydroxides which can be used are for example, sodium hydroxide, potassium hydroxide and ammonium hydroxide, while potassium hydroxide is preferred. Alkali metal carbonates which can be used are for example, potassium carbonate which is preferred and sodium carbonate.

In the practice of the invention, the palladium substrate is immersed in the activating bath, and then immersed in the stirred plating solution for an exposure time providing the requisite gold deposit thickness. Thereafter, the substrate is removed from the bath and immediately rinsed with distilled water to remove any residual plating chemicals from the plated gold metal surfaces. Generally, the rinse water is quickly removed by hot air or by sequential immersion of the substrate in a series of solvents.

In carrying out the gold plating of substrates on a continuing basis, all components of the formulation selected should be added to the plating bath at regular intervals or continuously to replenish the bath. Preferably, the components being added are introduced in aqueous form to replenish the bath to within 20% or less of its original concentration. The plating solution volume is maintained by introducing distilled water to offset water lost by evaporation.

In order that those skilled in the art will be better able to practice the present invention, the following example is given by way of illustration and not by way of limitation. All parts are by weight unless otherwise indicated.

EXAMPLE 1

A series of substrates in the form of a palladium foil, a gold foil and a substrate having electroless palladium deposited on electroless nickel were activated by immersing each substrate in a first activating solution in the form of a 50 volume % hydrochloric acid solution at 60° C. for 30–60 seconds. The respective substrates were then rinsed in distilled water for 30–60 seconds.

The respective substrates were then immersed into an electroless plating bath as described in table 1 above, at 85° C. for 20 minutes. After plating, the substrates were examined for gold thickness and uniformity. It was found that electroless deposition of gold onto the gold foil was 1.47 microns after 20 minutes in the bath. The gold deposit appeared to be very uniform and it had a nice lemon yellow appearance. No gold deposit was found on either palladium substrate.

The plating potentials were also markedly different. For example, on the gold foil, the potential (measured against a Ag/AgCl reference) was $-0.86V$ and remained constant throughout plating. In contrast, on palladium, the potential behaved quite differently on each substrate. On the palladium foil, the potential upon first entering the bath was $-0.85V$ but deteriorated quickly to $-0.62V$. On the substrate having electroless palladium deposit, the initial potential was $-0.76V$ and it deteriorated quickly to $-0.67V$.

The above procedure was repeated except that the respective substrates were immersed for 5 minutes at 85° C. in a second activating solution in the form of an aqueous solution of 0.8M KOH, 0.75M $K_2CO_3$, 0.05M of dimethylamine borane. The treated substrates were then immersed in the electroless gold bath as described above. It was found that the gold foil was electrolessly gold plated in a manner identical to the results shown in the first procedure. However, the gold deposition on the palladium substrates was dramatically improved. Deposition occurred almost immediately upon immersion of the palladium substrates into the bath. The gold thicknesses were a similar 1.1 microns, after 20 minutes and the colors were a uniform lemon yellow. The potential of the palladium substrates was also markedly different. The initial potential increased to $-0.895V$ and remained above $-0.84V$ throughout plating.

EXAMPLE 2

An $Al_2O_3$ substrate metallized with 0.1 micron of titanium and 1.0 microns of electroless palladium was activated with the second activating solution of example 1. It was then immersed in the gold solution of Table 1 for 20 minutes at 65° C. There was obtained a uniform, lemon yellow, deposition of gold having a 1.5 microns thickness.

Although the above examples are directed to only a few of the very many variables which can be employed in the practice of the method of the present invention, it should be understood that the present invention is directed to a much broader use of alkali metal hydroxides, and alkali metal carbonates and reducing agents as set forth in the description preceding this example.

What is claimed is:

1. A method for making a gold-palladium composite which comprises,
   (1) activating a palladium substrate by immersing it in an aqueous activating solution for at least 6 seconds at a temperature in the range of 50° C. to 100° C., where the aqueous activating solution comprises from about 2 to about 50% by weight solids, and consists essentially of about 1.0 to about 15% by weight of alkali metal hydroxide, about 1.0 to about 30% by weight of alkali metal carbonate and about 0.05 to about 5% by weight of a reducing agent based on the weight of aqueous activating solution, and
   (2) immersing the activated palladium substrate of (1) into an electroless gold bath until at least 0.1 micron of gold has been uniformly electrolessly deposited onto the palladium substrate.

2. A method in accordance with claim 1, where the palladium substrate is electrolessly deposited palladium on nickel or titanium.

3. A method in accordance with claim 1, where the aqueous activating solution consists of KOH, $K_2CO_3$ and dimethylamino borane.

* * * * *